(12) United States Patent
Nicollini et al.

(10) Patent No.: US 6,556,072 B1
(45) Date of Patent: *Apr. 29, 2003

(54) LOW DISTORTION CIRCUIT WITH SWITCHED CAPACITORS

(75) Inventors: Germano Nicollini, Piacenza (IT); Angelo Nagari, Cilavegna (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/791,281

(22) Filed: Jan. 30, 1997

Related U.S. Application Data (63) Continuation of application No. 08/425,375, filed on Apr. 20, 1995, now abandoned.

(51) Int. Cl.[7] .................................................. H03K 5/00
(52) U.S. Cl. ...................... 327/554; 327/337; 327/362; 330/9
(58) Field of Search ................................ 327/554, 362, 327/382, 336, 337, 345, 561, 94, 91, 65, 341; 330/9, 107, 109; 333/173

(56) References Cited

U.S. PATENT DOCUMENTS

| | | | | |
|---|---|---|---|---|
| 4,393,351 A | * | 7/1983 | Gregorian et al. | 327/337 |
| 4,743,872 A | * | 5/1988 | Tomimoto | 327/554 |
| 4,899,069 A | * | 2/1990 | Nicollini et al. | 327/554 |
| 5,187,390 A | * | 2/1993 | Scott, III | 327/91 |

FOREIGN PATENT DOCUMENTS

| | | | |
|---|---|---|---|
| EP | 0 439 276 | 7/1991 | H03H/19/00 |

OTHER PUBLICATIONS

"A Multiplexed Switched Capacitor Filter Bank", Patrick W. Bosshart, IEEE Journal of Solid State Circuits, vol. SC–15, No. 6, Dec. 1980, pp. 939–945.*

"Parasitic Insensitive, Biphase Switched Capacitor Filters Realized with One Operational Amplifier Per Pole Pair", Laker et al., The Bell Technical Journal, vol. 61, May/Jun. 1982, pp. 685–707.*

* cited by examiner

*Primary Examiner*—Dinh T. Le
(74) *Attorney, Agent, or Firm*—Lisa K. Jorgenson; Robert Iannucci; Seed IP Law Group PLLC

(57) ABSTRACT

A switched capacitor circuit comprising an operational amplifier, having first and second input terminals and an output terminal, the first input terminal being connected to a first reference potential. The operational amplifier is provided with a negative feedback network including a first capacitive element which is connected between the second input terminal and the output terminal of the operational amplifier, a second capacitive element which has a first terminal alternately connected to the second input terminal of the operational amplifier and to a reference potential, and a second terminal connected to a first circuit node which is alternately connected to a signal input terminal and said first output terminal of the operational amplifier. The circuit further includes a third capacitive element connected between the circuit node and a reference potential.

22 Claims, 5 Drawing Sheets

LOW DISTORTION CIRCUIT WITH SWITCHED CAPACITORS

CROSS-REFERENCE TO RELATED APPLICATION

This application is a continuation of U.S. patent application Ser. No. 08/425,375, filed Apr. 20, 1995, now abandoned.

TECHNICAL FIELD

This invention relates to switched capacitor circuits, in particular to a switched capacitor filter with reduced harmonic distortion.

BACKGROUND OF THE INVENTION

A switched capacitor circuit, also referred to briefly as SC circuit in literature, is a circuit capable of processing sampled analog signals using clock signals and switching circuit means driven by such signals.

Figure 1:
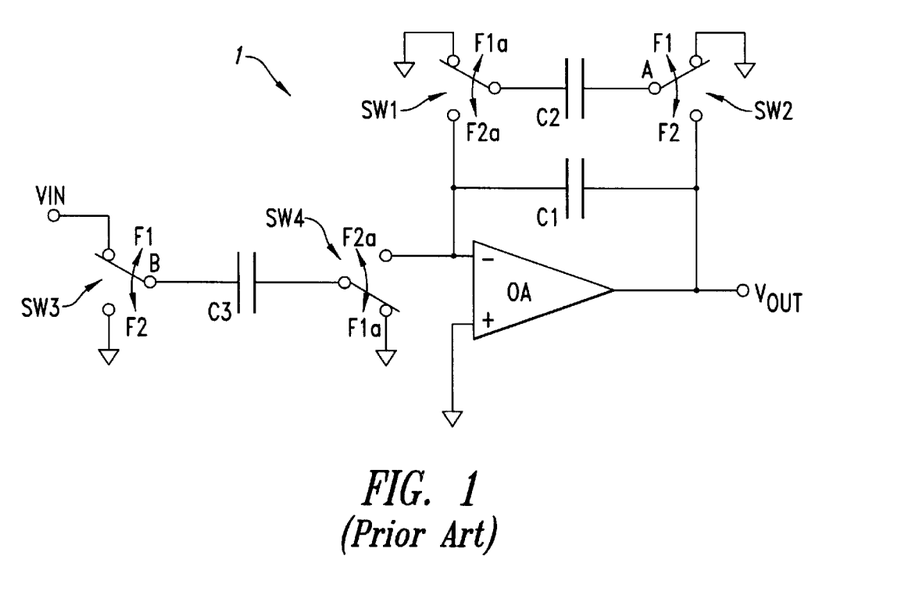
FIG. 1 is a diagram of a prior art SC circuit.

An example of an SC circuit is the SC integrator shown in FIG. 1, which constitutes a basic circuit block for obtaining an SC filter.

In this case, the four switching means of the circuit, denoted by SW1, SW2, SW3 and SW4 in the drawing figure, are electronic switches implemented with MOS transistors, and are driven each by two discrete non-overlapping phase clock signals.

In principle, there should occur no alterations to the charge stored in the capacitors of the SC circuits, and accordingly, the charge transfers should be exact ones.

However, due to the presence of parasitic capacitances associated with the channels of the MOS transistors used as switching means, this is not what precisely happens in actual practice.

In fact, these parasitic capacitances store an amount of charge which is proportional to the signal that appears at the terminals of the respective switching means, and when these charges are injected into the capacitors, the event produces a voltage offset in the system if said signal is a constant (DC) one, or an error in gain and an amount of harmonic distortion in the output signal if said signal is a varying one.

Several methods are described in literature for reducing this cause of harmonic distortion in switched capacitor circuits, although it is stated by D. G. Haigh and B. Singh in an ISCAS 1983 paper "A switching scheme for switched capacitor filters which reduces the effect of parasitic capacitances associated with switch control terminals" that in SC circuits with two non-overlapping phase clock signals, said harmonic distortion can never be brought below a definite level, calculated at around 40–50 dB.

This is indeed due to the presence of said parasitic capacitances associated with the channel of the MOS transistors employed as the switching means.

The solution proposed in the report mentioned above for reducing said harmonic distortion to a minimum, consists of using four discrete clock signals with non-overlapping phases, a method known to the skilled ones in the art as "four-phase clocking".

In another paper, "On switch-induced distortion in switched capacitor circuits", ISCAS 1988, D. G. Haigh and J. T. Taylor state that in switched capacitor filters, harmonic distortion never drops below values in the −68 dB range, not even when a four clocking signals system is used.

To solve the problem, it is proposed therein of increasing the transition time for the phases of the clocking signals to change from one state to the other.

However, if SC filters are to be designed with even lower harmonic distortion levels, the last-mentioned approach is no longer proposable because it would involve a very long transition time.

In the circuit shown in FIG. 1, which is an SC integrator of conventional construction, the electronic switches shown at SW1, SW2, SW3 and SW4 in the drawing figure may each comprise, for example, a pair of n-channel MOS transistors, or pair of p-channel transistors, or pair of CMOS transistors.

The latter choice is the most comprehensive one, and an obligatory one for values of the input/output signals comparable with the power supply ones.

Figure 2:
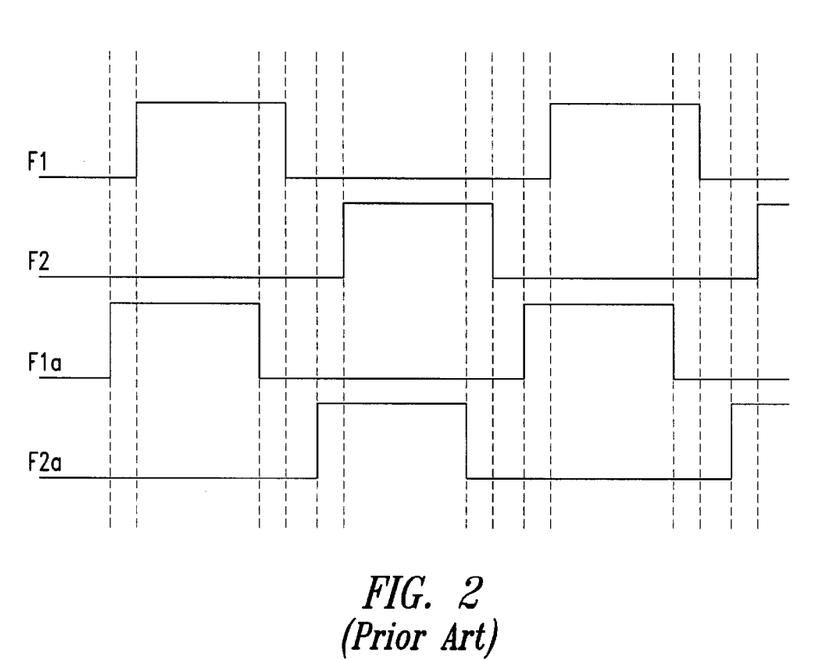
FIG. 2 shows the waveforms of four non-overlapping phase clocking signals as commonly used with circuits of the kind shown in FIG. 1.

The two transistors jointly making up a switch are driven by two clocking signals which do not overlap in time, such as the signals F1 and F2 and the signals F1a and F2a, whose waveforms are shown in FIG. 2.

Figure 3:
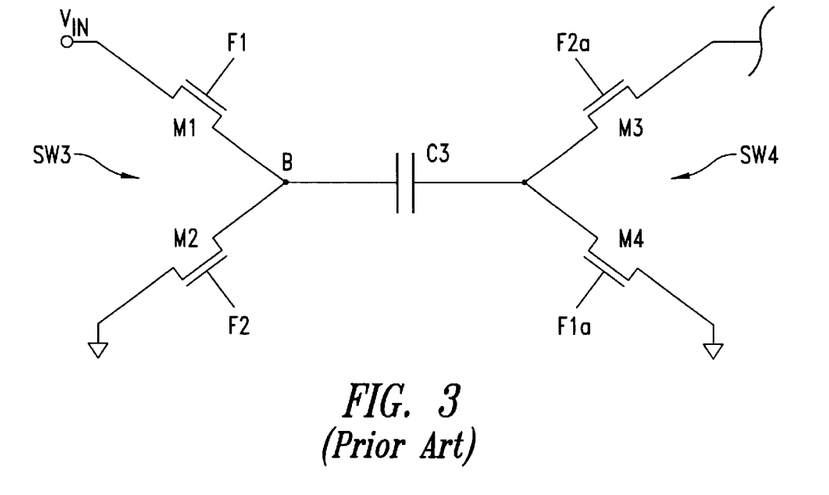
FIG. 3 shows a detail of the circuit diagram in FIG. 1, wherein the switching circuit means are n-channel field-effect transistors.

For an analysis of the effect of the charges stored in the channel by the MOS transistors, one should consider the input circuit of the integrator, shown best in FIG. 3, which comprises a capacitor C3 and the two switches SW3 and SW4.

Similar considerations would apply to the other switched capacitor C2 being feedback connected, together with the switches SW1 and SW2, to the operational amplifier included in the integrator.

The two n-channel MOS transistors, M1 and M2, which make up the switch SW3, are driven by the clocking signals F1 and F2, respectively, with the two transistors M3 and M4 of the switch SW4 being driven by the signals F1a and F2a, respectively.

As shown in FIG. 2, the signal F1a changes in level before the signal F1, and the signal F2a changes in level before the signal F2.

The charges stored in the channels of the transistors M1 and M2, in the conduction state, of the switch SW3 are not injected into the capacitor C3 because, upon such transistors being cut off by the drive signals F1 and F2, the other end of the capacitor C3 is floating, in that the signals F1a and F2a are at a low already.

The charges which are stored into the transistors M3 and M4 of the switch SW4 will now be considered.

Upon M3 being cut off, the charge stored in its channel is partly injected into the capacitor C3.

This amount of charge is, however, constant at all times, because the voltage across M3 is fixed (virtual ground of an operational amplifier) and the other end of the capacitor C3 is also connected to a fixed (ground) voltage reference via the transistor M2, which transistor is still in a conduction state.

This constant charge injection produces a voltage offset in the output signal, but no harmonic distortion.

The charge stored up in the transistor M4, which, in the transition to the cutoff state from the conduction state is injected into the capacitor C3, is a non-constant quantity, despite the voltage across M4 being a fixed (ground) one, because the other end of the capacitor C3, connected to a circuit node denoted by B in FIG. 3, is at the input voltage VIN.

The circuit node B sees, toward ground, an intrinsic parasitic capacitance Cp which is due to the source and drain diffusions of the two transistors M1 and M2, and a conduction resistance RON of the transistor M1.

As those familiar with the art will readily recognize, both the capacitance Cp and the resistance RON have a non-linear pattern versus voltage.

Since the voltage at the circuit node B varies with the voltage of the input signal VIN, it follows that the impedance seen toward ground from the circuit node B, and consisting of a parallel of the parasitic capacitance Cp and the conduction resistance RON of the transistor M1, will also vary with the input voltage.

This causes the amount of the charge injected into the capacitor C3 by the transistor M4 to be non-constant and vary with the input signal Vin, thereby adversely affecting the system linearity and introducing harmonic distortion in the output signal.

Therefore, it can be appreciated that there is a great need for SC circuits having a lower harmonic distortion than prior art SC circuits, without significantly increasing the circuit complexity and the area required for integration as an integrated circuit.

The advantages of an SC circuit according to the invention will be apparent from the description of an embodiment thereof, given by way of example and not of limitation with reference to the accompanying drawings.

SUMMARY OF THE INVENTION

The present invention is embodied in a switched capacitor circuit with low distortion having a circuit input terminal. The circuit includes a first switching element with the first switch terminal coupled to the circuit input terminal and a second switch terminal coupled to a reference level. The first switching element also includes a switch common terminal and a switch control to alternatively couple the switch common terminal to either the first or second switch terminals at a predetermined switching rate. The first switching element has a non-linear parasitic capacitance from the switch common terminal to the reference level and a non-linear conduction resistance from the first switch terminal to the switch common terminal when the switch control couples the first switch terminal to the switch common terminal. The combination of the non-linear parasitic capacitance and the non-linear conduction resistance form a non-linear impedance from the switch common terminal to the reference level. The circuit also includes a compensation impedance coupled from the switch common terminal to the reference level to linearize the non-linear impedance.

In one embodiment the compensation impedance is a capacitor selected to have a capacitance larger than the parasitic capacitance and an impedance lower than the conduction resistance at the predetermined switching rate. In one embodiment the circuit input terminal receives an audio input signal and the circuit further includes an audio amplifier with an amplifier input terminal and a coupling capacitor to couple the switch common terminal to the audio input terminal. In this embodiment, the circuit filters the audio input signal and provides filtered audio input signal to the audio amplifier. The circuit may include a second input switching element between the audio input terminal and the coupling capacitor with the second input switching element having first switch terminal coupled to the audio input terminal and a second switch terminal coupled to the reference level. A switch common terminal coupled to the coupling capacitor and a switch control alternatively couple the switch common terminal to the first switch terminal or the second switch terminal at the predetermined switching rate, such that the first and second switching elements, the coupling capacitor, and the compensation capacitor form an audio filter to filter the audio input signal.

The present invention is embodied in a switched capacitor circuit having circuit input and output terminals and includes an amplifier with an amplifier input and amplifier output terminals wherein the amplifier output terminal is the circuit output terminal. The circuit includes a first switch element having first and second switch terminals and a switch common terminal that is alternatively coupled to either the first or second switch terminals of the first switch element. The first switch terminal of the first switch element is coupled to the circuit input terminal and the second switch terminal of the first switch element being coupled to the amplifier output terminal. The amplifier also includes a second switch element also having first and second switch terminals and a switch common terminal alternatively coupled to either the first and second switch terminals of the second switch element. The first switch terminal of the second switch element is coupled to the amplifier input terminal and the second switch terminal of the second switch element is coupled a first reference voltage. The circuit also includes first and second impedance elements with the first impedance element coupled between the switch common terminal of the first switch element and the switch common terminal of the second switch element. The second impedance element is coupled between the switch common terminal of the first switch element in the second reference voltage. The circuit also includes first and second control signals to control the first and second switch elements, respectively. The first and second control signals cause the switch common terminal of the first switch element to be coupled to the circuit input terminal when the switch common terminal of the second switch element is coupled to the first reference voltage and causing the switch common terminal of the first switch element to be coupled to the amplifier output terminal when the switch common terminal of the second switch element is coupled to the amplifier input terminal.

DETAILED DESCRIPTION OF THE INVENTION

Figure 4:
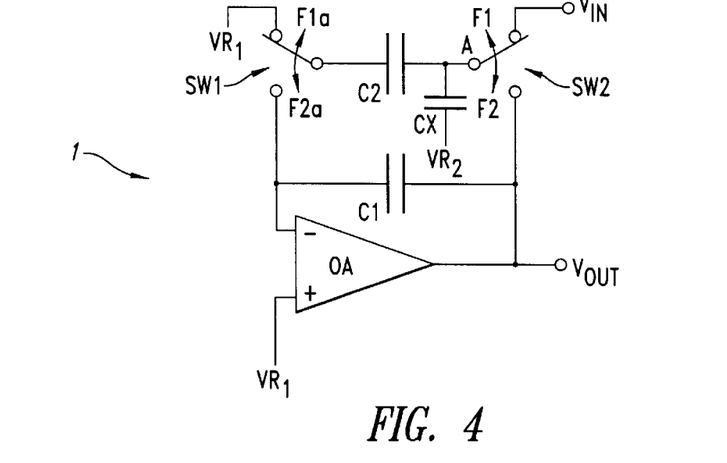
FIG. 4 shows a first embodiment of an SC circuit according to the invention.
Figure 5:
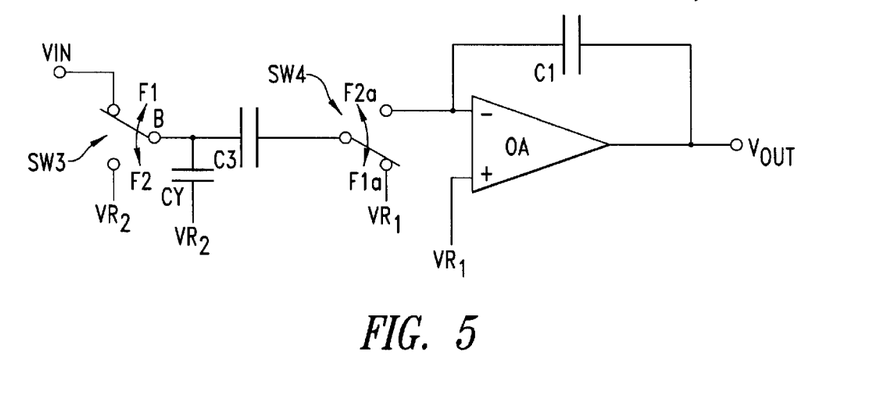
FIG. 5 shows a second embodiment of an SC circuit according to the invention.
Figure 6:
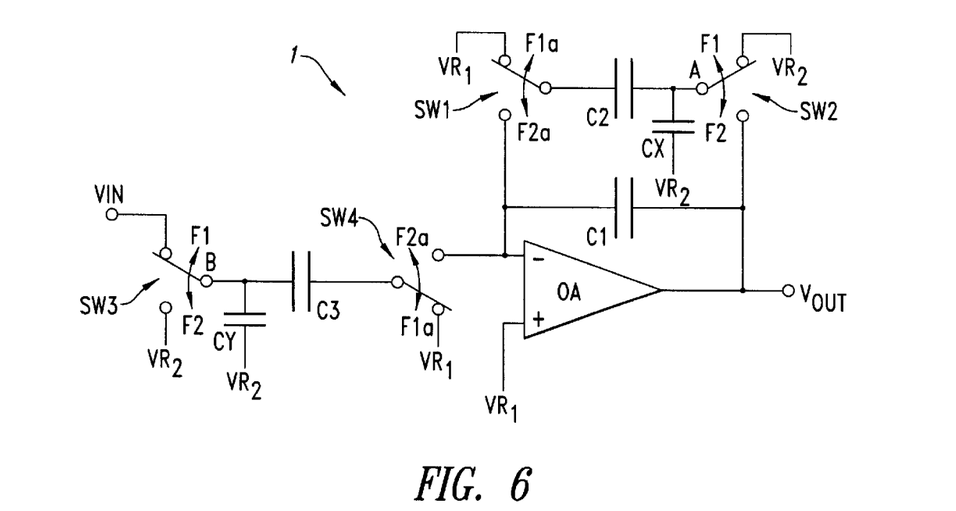
FIG. 6 shows a third embodiment of an SC circuit according to the invention.

The inventive circuit as shown in FIGS. 4, 5 and 6, does solve the above problem and offers significantly less harmonic distortion. The low harmonic distortion makes the present invention particularly useful in audio circuit, such as audio amplifiers, filters, telephone circuits, and the like.

FIG. 4 illustrates one embodiment of the present invention and includes an operational amplifier OA having input terminals and an output terminal. The prior art discloses most of the features of FIG. 4. For example, as is known in the prior art, a positive input terminal of the operational amplifier OA is coupled to a first reference potential $VR_1$. A feedback capacitor $C_1$ is coupled between a negative input terminal of the operational amplifier OA and the output terminal of the operational amplifier. A switched capacitor circuit is also coupled between the output terminal and the negative input terminal of the operational amplifier OA. A first switching circuit means $SW_1$, illustrated in FIG. 4 as a single-pole double-throw (SPDT) switch, has a switch common terminal which is alternately connected to the negative input terminal of the operational amplifier OA or the first reference potential $VR_1$. A second switching circuit means $SW_2$ is also illustrated in FIG. 4 as an SPDT switch. A switch common terminal of the second switching means is alternately coupled to a circuit input terminal $V_{IN}$ or the output terminal of the operational amplifier OA, which is also the circuit output terminal $V_{OUT}$. The switch common terminal of the first switching circuit means $SW_1$ is coupled to the switch common terminal of the second switching circuit means $SW_2$ by a second feedback capacitor $C_2$. The components described in FIG. 4 thus far comprise a switched capacitor circuit known in the art. For example, U.S. Pat. No. 4,899,069 to Nicollini illustrates each of these elements.

However, as described above, switched capacitor circuits suffer from nonlinear circuit response due to stray capacitances and the nonlinear conduction resistance of the transistors comprising the switching circuit means.

According to principles of the present invention, to compensate for these inherent nonlinearities, the circuit of FIG. 4 includes a linearization capacitor $C_x$ coupled between the switch common terminal of the second switching circuit means $SW_2$ and a second voltage reference potential $VR_2$. As will be described in greater detail below, linearization capacitors can be added to switched capacitor circuits to overcome the inherent nonlinearities described above.

The input section of FIG. 5 is identical to the input section of the prior art FIG. 1, except for one difference: a linearization capacitor $C_y$ that compensates for the inherent nonlinearities associated with the prior art circuit of FIG. 1. FIG. 5 shows an operational amplifier OA having two input terminals and an output terminal. A positive input terminal of the operational amplifier OA is coupled to a first reference voltage $VR_1$. A feedback capacitor $C_1$ is coupled between a negative input terminal of the operational amplifier OA and the output terminal of the operational amplifier. The output terminal of the operational amplifier is also the circuit output $V_{OUT}$. A switched capacitor circuit is also coupled to the negative input terminal of the operational amplifier. A switching circuit means $SW_3$, illustrated in the form of an SPDT switch, has a switch common terminal that is alternately coupled to an input terminal $V_{IN}$ and a second voltage reference potential $VR_2$. The circuit of FIG. 5 also includes a switching circuit means $SW_4$, also illustrated as an SPDT switch, having a switch common terminal that is alternately coupled to the negative input terminal of the operational amplifier OA and the first voltage reference potential $VR_1$. A capacitor $C_3$ is coupled between the switch common terminals of the switching circuit means $SW_3$ and the switching circuit means $SW_4$. As previously discussed, the circuit of FIG. 5 also includes the linearization capacitor $C_y$, which is coupled between the switch common terminal of the switching circuit means $SW_3$ and the second voltage reference potential $VR_2$. As will be described in detail below, the linearization capacitor $C_y$ overcomes the inherent nonlinearities of the conventional switched capacitor circuit.

FIG. 6 is a switched capacitor circuit identical to the conventional switched capacitor circuit illustrated in the prior art FIG. 1 except for the addition of the linearization capacitors $C_x$ and $C_y$. For the sake of brevity, the description of the prior art portions of the circuit of FIG. 6 will be discussed briefly at this point. The circuit of FIG. 6 also includes the feedback capacitor $C_1$ described above with respect to FIG. 5. In addition to the feedback capacitor $C_1$, the circuit of FIG. 6 includes a switched capacitor circuit coupled between the output terminal of the operational amplifier and the negative input terminal.

The switched capacitor feedback circuit of FIG. 6 includes a switching circuit means $SW_1$, illustrated in FIG. 6 as an SPDT switch, having a switch common terminal alternately coupled to the first voltage reference $VR_1$ and the negative input terminal of the operational amplifier OA. The switched capacitor feedback network also includes a switching circuit means $SW_2$, also illustrated as an SPDT switch, having, a switch common terminal alternately coupled to the second voltage reference potential $VR_2$ and the output terminal of the operational amplifier OA. It should be noted that the output terminal of the operational amplifier OA is also the circuit output $V_{OUT}$. The switched capacitor feedback circuit also includes a capacitor $C_2$ coupled between the switch common terminals of the switching circuit means $SW_1$ and the switch common terminal of the switching circuit means $SW_2$. In addition, the switched capacitor feedback circuit of FIG. 6 includes the linearization capacitor $C_x$ coupled between the switch common terminal of the switching circuit means $SW_2$ and the second voltage reference potential $VR_2$. As will be discussed below, the linearization capacitor $C_x$ overcomes the inherent nonlinearities associated with switched capacitor circuits of the prior art, such as illustrated in FIG. 1.

Figure 7:
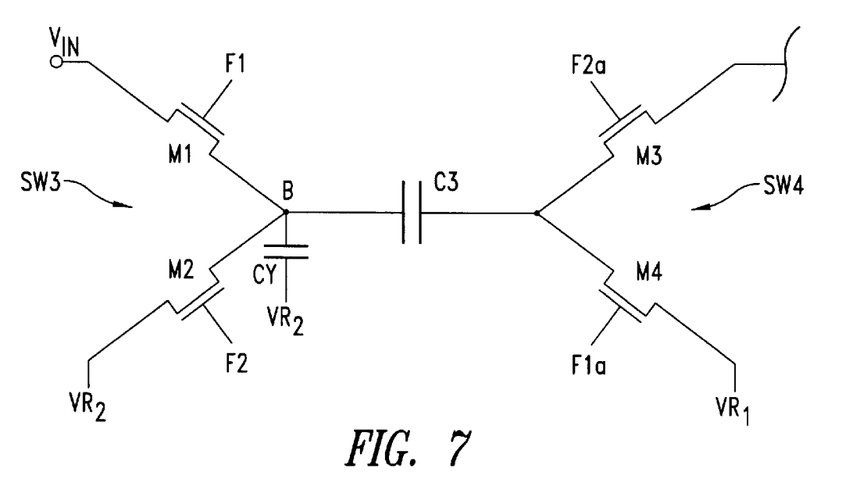
FIG. 7 shows a detail of the circuit diagram in FIG. 6, wherein the switching circuit means are field-effect transistors.

The circuit diagram of FIG. 7, which represents the input circuit for a circuit as shown in FIG. 6, has, compared with the conventional circuit diagram of FIG. 3, a capacitor CY connected between the circuit node B and ground.

This capacitor CY is in parallel with the impedance seen toward ground from the circuit node B.

By suitably sizing the capacitor CY so that its capacitance is much higher than the parasitic capacitance Cp of the node B and that its equivalent impedance is much lower than the conduction resistance Ron of the transistors at a frequency equal to the inverse of the decay time of the clocking signals used to drive the switch transistors, the overall impedance as seen from the circuit-node B toward ground can be linearized.

A typical value of the parasitic capacitance at the node B, due to the source and drain diffusions of the transistors M1 and M2, would be Cpo=0.1 pF.

This capacitance varies non-linearly with the voltage applied across it in accordance with the empiric formula, $$Cp = \frac{Cpo}{\left(\frac{1+V}{.08}\right)^{0.38}}$$

The equivalent resistance associated with said capacitance is given by the formula, $$Reqp = \frac{1}{\left(\frac{2\pi}{tf}\right) \cdot Cp}$$

where, tf is the decay time of the clocking signals used for driving the switch transistors, which time may be 3 ns, for example.

Figure 8:
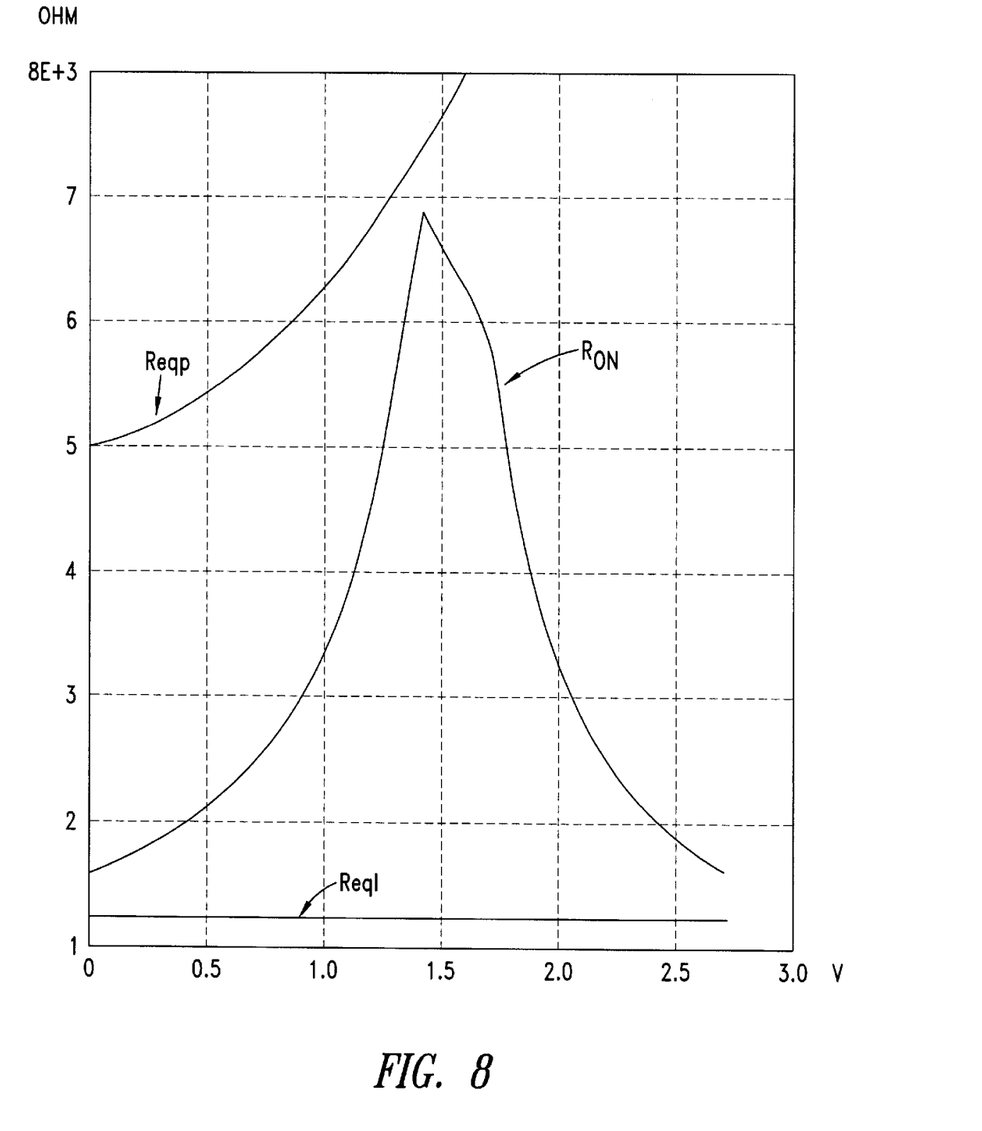
FIG. 8 is a graph showing the values of the equivalent resistances of some circuit components plotted against voltage.

The pattern of the resistance Reqp vs. voltage is illustrated by the graph of FIG. 8.

Also shown in that graph are the pattern of the conduction resistance Ron of the MOS transistors employed and that of the equivalent resistance of the added capacitance CY at the node B.

It can be seen that, for a capacitance CY of 0.4 pF, the equivalent resistance is much smaller than the other two resistances, and what is more, linear with voltage.

The equivalent resistance of the capacitor CY is given by the formula, $$Reqp = \frac{1}{\left(\frac{2\pi}{tf}\right) \cdot CY}$$

which, as can be seen, is unrelated to voltage.

The overall equivalent resistance at the node B is given by a parallel of the three resistances plotted on the graph of FIG. 8. This equivalent resistance closely approximates, both in value and pattern vs. voltage, the smallest of the three resistances, namely the equivalent resistance of the capacitor CY.

As previously explained in connection with the conventional input circuit of FIG. 3, the equivalent resistance that the node B sees toward ground only becomes influential, as concerns circuit distortion, upon the transistor M4 passing from the conduction state to the cutoff state.

The charges which have been built up in the transistor channel are, in fact, partly injected-into the capacitor C3 in a proportional amount to the impedance present at the other end of the capacitor.

When the other end of the capacitor, connected to the circuit node B, sees toward ground a resistance which is unrelated to the voltage at the node, the amount of injected charge is always a constant one unrelated to the input signal voltage.

This constant charge injection causes a voltage offset in the output signal, but has no bearing on the system harmonic distortion.

Similar considerations would also apply to the other two examples of an SC circuit embodying this invention, shown in FIGS. 4 and 5.

Thus, the circuit of this invention does solve the aforementioned technical problem, and obtains a number of advantages, outstanding among which is that the effects from the parasitic capacitances, associated with the channel of the MOS transistors serving as electronic switches in circuits of this kind, can be significantly reduced and very low distortion, typically below −80 dB, SC circuits be provided. This is particularly useful if the amplifier OA is an audio amplifier, and the input signal VIN is an audio input signal.

A further advantage is that the circuit complexity and the area required for integration of the circuit are kept practically unaltered. Thus, the switched capacitor circuit of the present invention can be monolithically integrated to the substrate of a semiconductor material.

It should be understood that many modifications, adaptations, integrations, changes, and replacements of elements with functional equivalents thereof may be made unto the embodiments described hereinabove by way of examples and not of limitation without departing from the protection scope of the following claims.

What is claimed is:

1. A switched capacitor circuit having circuit input and output terminals, comprising:
    an amplifier having an amplifier input terminal and an amplifier output terminal, said amplifier output terminal being the circuit output terminal;
    a first switch element having first and second switch terminals and a switch common terminal alternatively coupled to said first and second switch terminals of said first switch element, said first switch terminal of said first switch element coupled to the circuit input terminal and said second switch terminal of said first switch element coupled to a first reference voltage;
    a second switch element having first and second switch terminals and a switch common terminal alternatively coupled to said first and second switch terminals of said second switch element, said first switch terminal of said second switch element coupled to said amplifier input terminal and said second switch terminal of said second switch element coupled to a second reference voltage;
    a first impedance element coupled between said switch common terminal of said first switch element and said switch common terminal of said second switch element;
    a second impedance element coupled between said switch common terminal of said first switch element and said first reference voltage; and
    first and second control signals controlling said first and second switch elements, respectively, and causing said switch common terminal of said first switch element to be coupled to the circuit input terminal when said switch common terminal of said second switch element is coupled to said second reference voltage and causing said switch common terminal of said first switch element to be coupled to said first reference voltage when said switch common terminal of said second switch element is coupled to said amplifier input terminal.

2. The circuit of claim 1 wherein said amplifier is an operational amplifier having first and second operational amplifier input terminals and an operational amplifier output terminal, said first operational amplifier input terminal being said amplifier input terminal and said second operational amplifier input terminal being coupled to said first reference voltage, said operational amplifier output terminal being said amplifier output terminal.

3. The circuit of claim 1 wherein said first reference voltage is the same as said second reference voltage.

4. The circuit of claim 1 wherein said first switch element comprises first and second switching transistors.

5. The circuit of claim 1 wherein said second switch element comprises first and second switching transistors.

6. The circuit of claim 1 wherein said first switch element comprises first and second switching transistors, and said second switch element comprises third and fourth switching transistors, the circuit further including third and fourth control signals wherein said first, second, third, and fourth control signals control said first, second, third, and fourth transistors, respectively, to form a four phase clocking control of said first, second, third, and fourth transistors.

7. The circuit of claim 1 wherein said first and second impedance elements are capacitors.

8. The circuit of claim 1 wherein said first switch element has a conduction resistance and said second impedance has an equivalent resistance, said second impedance element having a value selected so that said equivalent resistance is less than said conduction resistance.

9. The circuit of claim 1 wherein said amplifier, said first and second switch elements, and said first and second impedance elements are integrally formed on an integrated circuit substrate.

10. A switched capacitor circuit having circuit input and output terminals, comprising:

an amplifier having an amplifier input terminal and an amplifier output terminal, said amplifier output terminal being the circuit output terminal;

a first switch element having first and second switch terminals and a switch common terminal alternatively coupled to said first and second switch terminals of said first switch element, said first switch terminal of said first switch element being coupled to the circuit input terminal and said second switch terminal of said first switch element being coupled to said amplifier output terminal;

a second switch element having first and second switch terminals and a switch common terminal alternatively coupled to said first and second switch terminals of said second switch element, said first switch terminal of said second switch element being coupled to said amplifier input terminal and said second switch terminal of said second switch element coupled to a first reference voltage;

a first impedance element coupled between said switch common terminal of said first switch element and said switch common terminal of said second switch element;

a second impedance element coupled between said switch common terminal of said first switch element and a second reference voltage; and first and second control signals controlling said first and second switch elements, respectively, and causing, said switch common terminal of said first switch element to be coupled to the circuit input terminal when said switch common terminal of said second switch element is coupled to said first reference voltage and causing said switch common terminal of said first switch element to be coupled to said amplifier output terminal when said switch common terminal of said second switch element is coupled to said amplifier input terminal wherein said switch common terminal of said first switch element is coupled to said circuit input terminal or said amplifier output terminal greater than one half the time.

11. The circuit of claim 10 wherein said amplifier is an operational amplifier having first and second operational amplifier input terminals and an operational amplifier output terminal, said first operational amplifier input terminal being said amplifier input terminal and said second operational amplifier input terminal being coupled to said first reference voltage, said operational amplifier output terminal being said amplifier output terminal.

12. The circuit of claim 10 wherein said first reference voltage is the same as said second reference voltage.

13. The circuit of claim 10 wherein said first switch element comprises first and second switching transistors.

14. The circuit of claim 10 wherein said second switch element comprises first and second switching transistors.

15. The circuit of claim 10 wherein said first switch element comprises first and second switching transistors, and said second switch element comprises third and fourth switching transistors, the circuit further including third and fourth control signals wherein said first, second, third, and fourth control signals control said first, second, third, and fourth transistors, respectively, to form a four phase clocking control of said first, second, third, and fourth transistors.

16. The circuit of claim 10 wherein said first and second impedance elements are capacitors.

17. The circuit of claim 10 wherein said first switch element has a conduction resistance and said second impedance has an equivalent resistance, said second impedance element having a value selected so that said equivalent resistance is less than said conduction resistance.

18. The circuit of claim 10 wherein said amplifier, said first and second switch elements, and said first and second impedance elements are integrally formed on an integrated circuit substrate.

19. A switched capacitor circuit with low distortion having a circuit input terminal, the circuit comprising:

a first switching element with a first switch terminal coupled to the circuit input terminal and a second switch terminal coupled to a reference level, a switch common terminal, and a switch control to alternatively couple said switch common terminal to said first switch terminal or said second switch terminal at a predetermined switching rate, said first switching element having a nonlinear parasitic capacitance from said switch common terminal to said reference level and a nonlinear conduction resistance from said first switch terminal to said switch common terminal when said switch control couples said first switch terminal to said switch common terminal, said nonlinear parasitic capacitance and said nonlinear conduction resistance forming a nonlinear impedance from said switch common terminal to said reference level; and a compensation capacitance coupled from said switch common terminal to said reference level to linearize said nonlinear impedance from said switch common terminal to said reference level, wherein said compensation capacitance has a capacitance value larger than said parasitic capacitance and an impedance lower than said conduction resistance at said predetermined switching rate.

20. The circuit of claim 19 wherein an audio input signal is coupled to the circuit input terminal, the circuit further including an audio amplifier with an amplifier input terminal, and a coupling capacitor coupling said switch common terminal to said audio input terminal, whereby the circuit filters the audio input signal and provides a filtered audio input signal to said audio amplifier.

21. The circuit of claim 20, further including a second input switching element between said audio input terminal and said coupling capacitor, said second input switching element having a first switch terminal coupled to said audio input terminal, a second switch terminal coupled to said reference level, a switch common terminal coupled to said coupling capacitor, and a switch control to alternatively couple said switch common terminal to said first switch terminal or said second switch terminal at said predetermined switching rate, whereby said first and second switching elements, said coupling capacitor, and said compensation capacitor form an audio filter to filter the audio input signal.

22. A method of compensating for non-linear effects in a switched capacitor circuit switched at a predetermined frequency, the method comprising:

connecting a first end of a first capacitor to a circuit node alternately connected, through a first switch circuit, to a circuit input and a first voltage reference, said circuit node having an intrinsic parasitic capacitance between said circuit node and said first voltage reference;

alternately connecting a second end of said first capacitor, through a second switch circuit, to an amplifier input and a second voltage reference; and adding a second capacitor between said circuit node and said first voltage reference to compensate for the non-linear effects of the switched capacitor circuit, said second capacitor being selected to have a capacitance greater than said parasitic capacitance and an impedance lower than a conduction resistance of said first and second switch circuits at the predetermined frequency.

* * * * *

UNITED STATES PATENT AND TRADEMARK OFFICE
CERTIFICATE OF CORRECTION

PATENT NO. : 6,556,072 B1
DATED : April 29, 2003
INVENTOR(S) : Germano Nicollini et al.

It is certified that error appears in the above-identified patent and that said Letters Patent is hereby corrected as shown below:

<u>Title page,</u>
Item [30], Foreign Application Priority Data, should read as:
-- April 21, 1994 (EP) ......... 94830189.0 --

Signed and Sealed this

Seventh Day of October, 2003

JAMES E. ROGAN
*Director of the United States Patent and Trademark Office*